United States Patent
Fujita

(10) Patent No.: US 7,480,198 B2
(45) Date of Patent: Jan. 20, 2009

(54) SEMICONDUCTOR MEMORY DEVICE AND DRIVING METHOD OF SEMICONDUCTOR MEMORY DEVICE

(75) Inventor: Katsuyuki Fujita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 144 days.

(21) Appl. No.: 11/680,999

(22) Filed: Mar. 1, 2007

(65) Prior Publication Data
US 2007/0217269 A1   Sep. 20, 2007

(30) Foreign Application Priority Data
Mar. 20, 2006   (JP) ............................. 2006-76273

(51) Int. Cl.
*G11C 7/00* (2006.01)
(52) U.S. Cl. ..................... 365/205; 365/207
(58) Field of Classification Search ................. 365/205, 365/207, 185.21
See application file for complete search history.

(56) References Cited

U.S. PATENT DOCUMENTS

| | | | | |
|---|---|---|---|---|
| 5,148,399 A | * | 9/1992 | Cho et al. | 365/205 |
| 5,159,415 A | * | 10/1992 | Min | 257/196 |
| 6,333,883 B2 | * | 12/2001 | Wakayama et al. | 365/205 |
| 6,567,330 B2 | | 5/2003 | Fujita et al. | |
| 7,313,041 B1 | * | 12/2007 | Chapman et al. | 365/207 |
| 2006/0274590 A1 | | 12/2006 | Fujita et al. | |

OTHER PUBLICATIONS

U.S. Appl. No. 11/444,487, filed Jun. 1, 2006, Fujita et al.
Takashi Ohsawa, et al., "An 18.5ns 128Mb SOI DRAM. with a Floating Body Cell", 2005 International Solid-State Circuits Conference, ISSCC Digest of Technical Papers, Session 25, 25.1, Feb. 9, 2005, pp. 458-459 and 609.

* cited by examiner

*Primary Examiner*—Anh Phung
(74) *Attorney, Agent, or Firm*—Oblon, Spivak, McClelland, Maier & Neustadt, P.C.

(57) ABSTRACT

This disclosure concerns a semiconductor memory device comprising memory cells; word lines connected to gates of the memory cells; bit lines connected to drains or sources of the memory cells and transmitting data of the memory cells; sense nodes connected to the bit lines and transmitting data of the memory cells; transfer gates connected to between the bit lines and the sense nodes; and latch circuits latching data to the sense nodes, wherein in a data read operation, a selection word line is in an inactive state during a latch period which is from immediately before the latch circuits start a data latch operation until when the transfer gate disconnects the bit lines from the sense nodes after the latch operation, the selection word line being one of the word lines and being connected to selection memory cells from which data is to be read to the sense nodes.

20 Claims, 8 Drawing Sheets

SEMICONDUCTOR MEMORY DEVICE AND DRIVING METHOD OF SEMICONDUCTOR MEMORY DEVICE

CROSS-REFERENCE TO RELATED APPLICATION

This application is based upon and claims the benefit of priority from the prior Japanese Patent Applications No. 2006-76273, filed on Mar. 20, 2006, the entire contents of which are incorporated herein by reference.

BACKGROUND OF THE INVENTION

1. Field of the Invention

The present invention relates to a semiconductor memory device and a driving method of a semiconductor memory device.

2. Related Art

In recent years, an FBC (Floating Body Cell) memory device is available as a semiconductor memory device which is expected to replace a DRAM. The FBC memory device includes an N-type MOS transistor having a floating body on an SOI (Silicon On Insulator) substrate, as a memory cell, and stores data "1" or "0" depending on a number of holes accumulated in this body area. When the memory cell is an N-type FET, for example, a state that the number of holes accumulated in the body area is large is expressed by data "1", and a state that the number of holes accumulated in the body area is small is expressed by data "0". As a result, a threshold voltage of a memory cell that stores data "1" becomes low. A threshold voltage of a memory cell that stores data "0" becomes high.

When a memory cell is set to an on state, a part of electrons within an inversion layer is trapped at an interface potential at the interface between a gate oxide film and the body area. Positive holes accumulated in the body area are combined with electrons, and disappear. When this is repeated, the state of data "1" in non-selected memory cells change to data "0". This is called a charge pumping phenomenon.

Therefore, the FBC memory device requires a periodical refresh operation of the cells of data "1".

However, in the case of the FBC, a threshold value of the memory cell storing data "1" is low, and a threshold value of the memory cell storing data "0" is high. Therefore, a CMOS cross-coupled latch sense amplifier provided between a pair of sense nodes needs to theoretically inverse data and write back (restore) the data into a memory cell, after latching a potential difference of sense nodes in the data reading. For example, during the reading, data of a pair of bits BL and BBL are transmitted to a pair of sense nodes SN and BSN, respectively, and data of a pair of sense nodes SN and BSN are transmitted to a pair of bit lines BBL and BL during the writing. In order to restore data by inversing the data at the refresh time, transfer gates TG2 are provided to connect between the bit line BL and the sense node BSN and between the bit line BBL and the sense node SN, in addition to transfer gates TG1 that connect between the bit line BL and the sense node SN and between the bit line BBL and the sense node BSN. During the reading, the gate TG1 is on and the gate TG2 is off. During the restoring, the gate TG2 is on and the gate TG1 is off.

In this case, in a case of shifting from a reading operation to a restore operation, the timing of turning off the gate TG1 and the timing of turning off the latch sense amplifier become a problem. Conventionally, there are a specification 1 for simultaneously turning off the gate TG1 and the latch sense amplifier or turning off the gate TG1 earlier, and a specification 2 for turning off the latch sense amplifier earlier than the gate TG1.

According to the specification 1, the sense node is disconnected from the bit line at the time of latching data. Therefore, capacity of the sense node becomes small, and data on the sense node becomes unstable. As a result, there is a risk that the latch sense amplifier recognizes data by error. On the other hand, according to the specification 2, when the latch sense amplifier latches data, the sense node is connected to the bit line. Therefore, there is a risk that an inverse logic signal is transmitted to the bit line. Accordingly, the inverse logic data is stored into the memory cell at the data latch time. When data "1" is written back at the refresh time, a drain voltage is weaker than that when data "1" is written. Therefore, when data "0" is once written back by error, there is a high potential that the data "0" cannot be returned to data "1".

SUMMARY OF THE INVENTION

A semiconductor memory device according to an embodiment of the present invention comprises memory cells including floating bodies in an electrically floating state and storing data based on a number of majority carriers within the floating bodies; word lines connected to gates of the memory cells; bit lines connected to drains or sources of the memory cells and transmitting data of the memory cells; sense nodes connected to the bit lines and transmitting data of the memory cells; transfer gates connected to between the bit lines and the sense nodes; and latch circuits latching data to the sense nodes, wherein in a data read operation, a selection word line is in an inactive state during a latch period which is from immediately before the latch circuits start a data latch operation until when the transfer gate disconnects the bit lines from the sense nodes after the latch operation, the selection word line being one of the word lines and being connected to selection memory cells from which data is to be read to the sense nodes.

A semiconductor memory device according to an embodiment of the present invention comprises memory cells including floating bodies in an electrically floating state and storing data based on a number of majority carriers within the floating bodies; word lines connected to gates of the memory cells; local bit lines connected to drains or sources of the memory cells and transmitting data of the memory cells; global bit lines respectively provided corresponding to a plurality of the local bit lines; first transfer gates connected to between the global bit lines and the local bit lines; sense nodes connected to the global bit lines and transmitting data of the memory cells; second transfer gates connected to between the global bit lines and the sense nodes; and latch circuits latching data to the sense nodes, wherein in a data read operation, the first transfer gates between selection local bit lines and the global bit lines are set to off during a latch period from immediately before the latch circuits start a data latch operation until when the second transfer gates disconnect the global bit lines from the sense nodes after the latch operation, the selection local bit lines being included in the local bit lines and being connected to selection memory cells from which data is to be read.

A driving method of a semiconductor memory device according to an embodiment of the present invention comprises, the semiconductor memory device comprising memory cells including floating bodies in an electrically floating state and storing data based on a number of majority carriers within the floating bodies; word lines connected to gates of the memory cells; bit lines connected to drains or sources of the memory cells and transmitting data of the memory cells; sense nodes connected to the bit lines and transmitting data of the memory cells; transfer gates connected to between the bit lines and the sense nodes; and latch circuits latching data to the sense nodes, the driving method comprises activating a selection word line during a sense period in which data of selection memory cells is detected, the selection word line being one of the word lines and being connected to the selection memory cells from which data is to be read; inactivating the selection word line during a latch period from immediately before the latch circuits start a data latch operation until when the transfer gates disconnect the bit lines from the sense nodes after the latch operation; and activating the selection word line during a restore period in which the latch circuits write back latched data into the selection memory cells.

DETAILED DESCRIPTION OF THE INVENTION

Embodiments of the present invention will be explained below with reference to the accompanying drawings. The present invention is not limited to the embodiments.

First Embodiment

Figure 1:
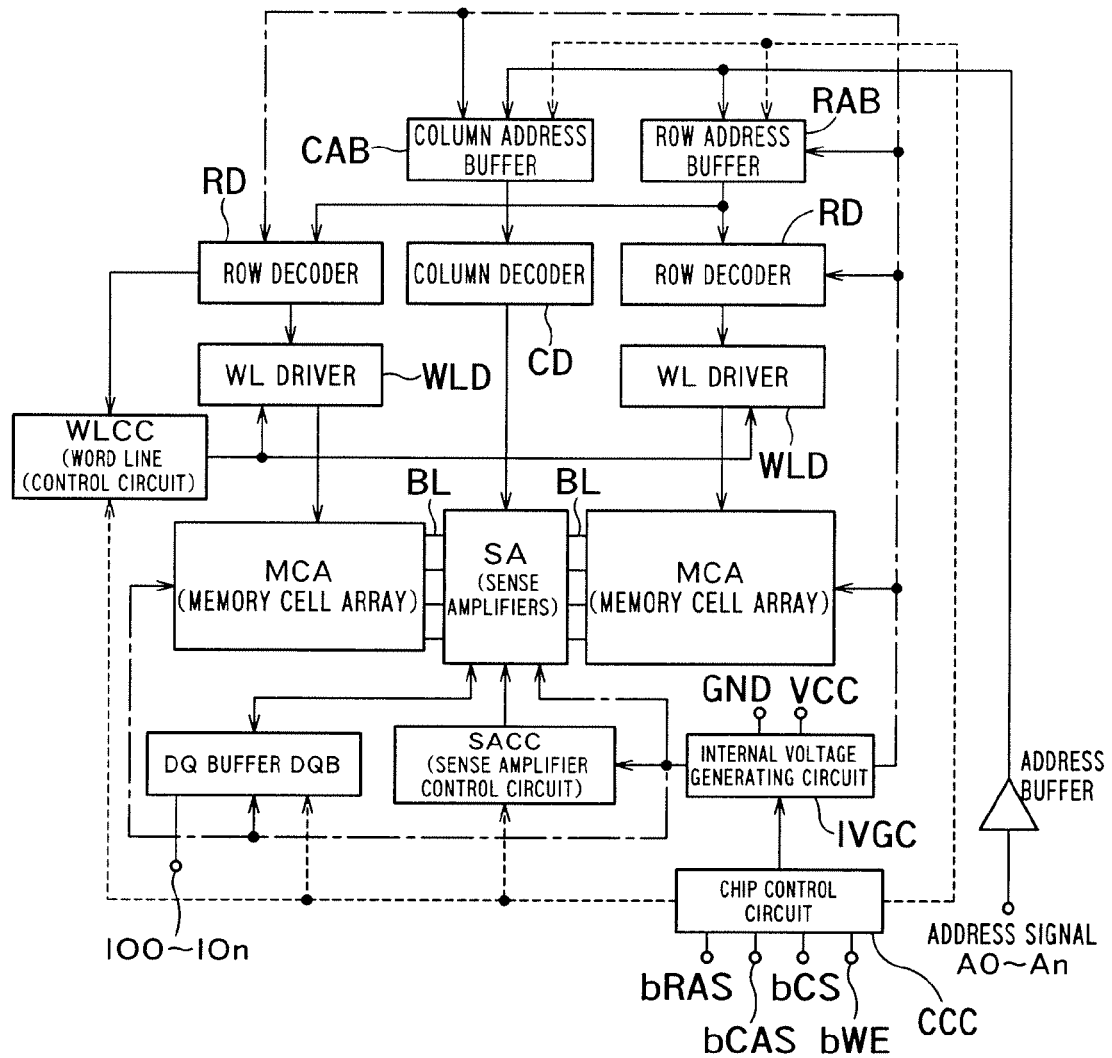
FIG. 1 is a block diagram showing a configuration of an FBC memory 100 according to a first embodiment of the present invention.

FIG. 1 is a block diagram showing a configuration of an FBC memory 100 according to a first embodiment of the present invention. Solid line arrowheads in FIG. 1 show paths of address signals. Broken line arrowheads show paths of control signals. Dashed lines show paths of a power supply voltage.

The FBC memory 100 includes memory cell arrays MCAs, a sense amplifier SA provided between the adjacent memory cell arrays MCAs, word line drivers WLDs, row decoders RDs, a column decoder CD, a word line controller WLC, a column address buffer CAB, a row address buffer RAB, a DQ buffer DQB, a sense amplifier control circuit SACC, an internal voltage generating circuit IVGC, a chip control circuit CCC, and a word line control circuit WLCC. In the present embodiment, a direction in which the word line WL extends is a column direction, and a direction in which the bit line BL extends is a row direction.

The row decoder RD receives a row address from the row address buffer RAB, and operates the word line driver WLD following the row address signal. The word line driver WLD selects a word line of the memory cell array MCA following the row address from the row decoder RD, and drives the memory cell array. The column decoder CD receives a column address from the column address buffer CAB. The column decoder CD selects a bit line of the memory cell array MCA following the column address. A memory cell connected to a selected word line (hereinafter, also "selection word line") and a selected bit line (hereinafter, also "selection bit line"), that is, a memory cell located at the intersection between the selected word line and the selected bit line becomes a selection memory cell from which data is read/into which data is written. Out of the memory cells connected to the selection word line, memory cells other than the selection memory cell are non-selection memory cells.

The DQ buffer DQB is connected to pads IO0 to IOn for connection to an external apparatus. Accordingly, the DQ buffer DQB can temporarily store data to be output to an external apparatus during data reading, and can temporarily store data to be input from an external apparatus during data writing. The data reading/writing operation is an operation of reading data of the memory cell MC and outputting this data to the outside via the DQ buffer, and an operation of writing new data into the memory cell MC thereby updating the data. The refresh operation is an operation of once reading data from the memory cell MC connected to the activated word line, and writing back this data into the same memory. The refresh operation is carried out to all memory cells MCs by sequentially selecting the word lines WLs in the order of addresses. In the refresh operation, the DQ buffer DQB is not substantially used.

The sense amplifier control circuit SACC controls the operation of various signal groups input to the sense amplifier SA. Upon receiving the control of the sense amplifier control circuit SACC, the sense amplifier SA can read data of the memory cell within the memory cell array MCA via the bit line BL, and can latch this data. Further, the sense amplifier SA can write the data latched via the bit line BL into the memory cell.

The internal voltage generating circuit IVGC generates a necessary potential for each structure within the FBC memory device 100 from a power supply VCC and a ground GND, and supplies this potential to each structure. The chip control circuit CCC inputs signals bRAS, bCAS, bCS, bWE, and controls the column address buffer CAB, the row address buffer RAB, the internal voltage generating circuit IVGC, the DQ buffer DQB, the sense amplifier control circuit SACC, and the word line control circuit WLCC.

The word line control circuit WLCC is connected to between the word line driver WLD and the row decoder RD, and controls the word line driver WLD upon receiving the control of the chip control circuit CCC. Upon receiving the control of the word line control circuit WLCC, the word line driver WLD can start or decline a selection word line at a predetermined timing.

Figure 2:
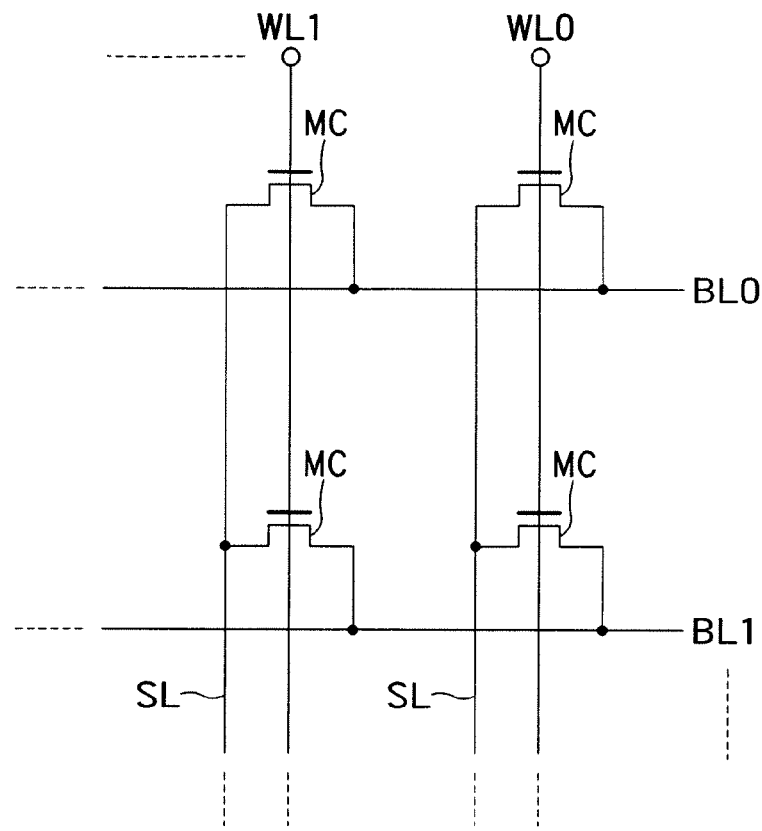
FIG. 2 is a circuit diagram showing a part of the inside of the memory cell array MCA.

FIG. 2 is a circuit diagram showing a part of the inside of the memory cell array MCA. The memory cell array MCA includes the memory cells MCs arrayed in a matrix. While four memory cells MCs are shown in FIG. 2, more memory cells are actually arrayed in a matrix shape. Word lines WLi (i is an integer) are connected to gates of the memory cells MCs. Bit lines BLi are connected to either drains or sources of the memory cells MCs, and transmit data of the memory cells MCs. The word lines WLi and the bit lines BLi cross each other, and a memory cell MC is preset at each intersection.

The other of sources or drains of the memory cells MCs are connected to a source line SL.

Figure 3:
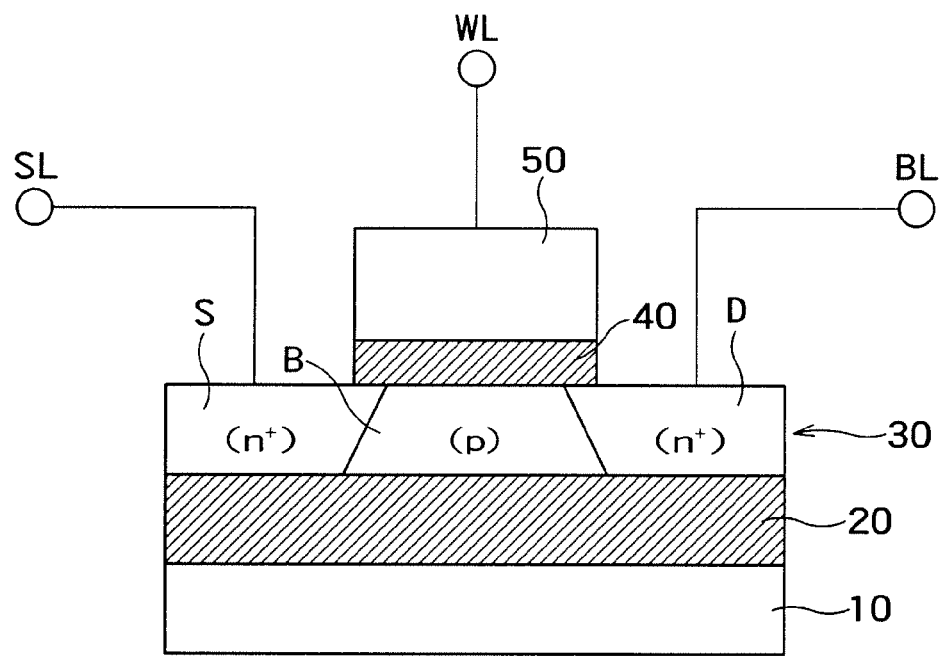
FIG. 3 is a cross-sectional diagram showing a configuration of a memory cell MC.

FIG. 3 is a cross-sectional diagram showing a configuration of a memory cell MC. The memory cell MC is formed on an SOI substrate including a supporting substrate 10, a BOX (Berried Oxidation) layer 20, and an SOI layer 30. A source S, a drain D, and a floating body area (hereinafter, simply "body area") B are formed on the SOI layer 30. The source S is connected to a source line SL, and the drain D is connected to a bit line BL. A gate insulation film 40 is provided on the body area B. A gate electrode 50 is provided on the gate insulation film 40. The gate electrode 50 is connected to the word line WL.

The body area B including a p-type semiconductor is sandwiched between the source S and the drain D consisting of an n+ type semiconductor, at the left and right sides. The gate insulation film 40 and the BOX layer 20 are present on and beneath the body area B, respectively. Further, an STI (Shallow Trench Isolation) (not shown) is present as an element isolation area before and after the body area B, respectively. Because the body area B is encircled by the source S, the drain D, the gate insulation film 40, the BOX layer 20, and the STI, the body area B is in an electrically floating state.

The FBC can store data "1" and data "0" by accumulating/discharging holes as majority carriers in this body area B. When the memory cell MC is an n-type FET, the sense amplifier SA detects data "1" when the number of holes accumulated within the body area B is relatively large, and detects data "0" when the number is relatively small.

Figure 4:
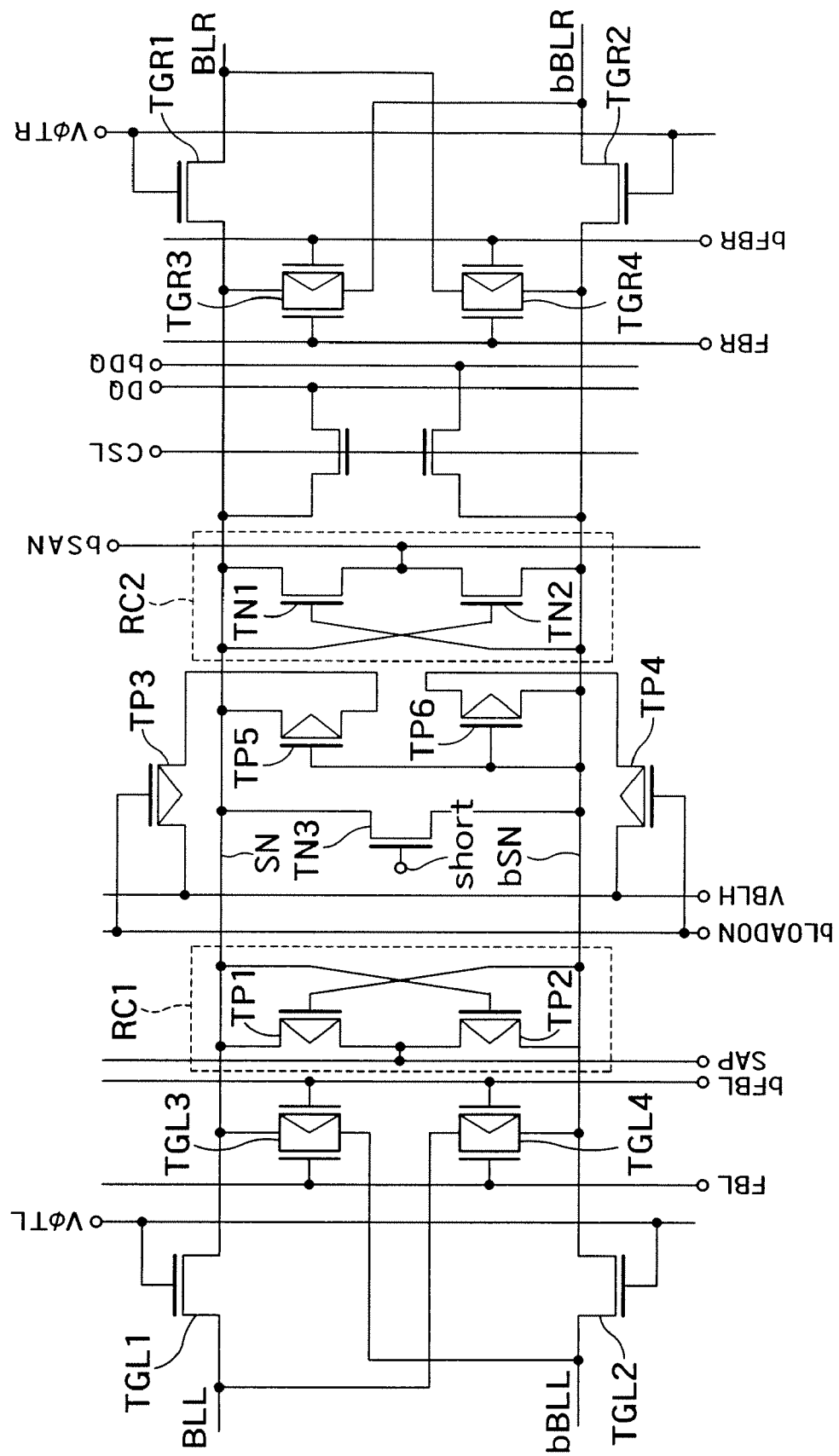
FIG. 4 is a circuit diagram showing an internal configuration of the sense amplifier SA.

FIG. 4 is a circuit diagram showing an internal configuration of the sense amplifier SA. FIG. 4 shows the sense amplifier SA corresponding to a pair of bit lines BLL, bBLL and a pair of bit lines BLR, bBLR. The pair of bit lines BLL, bBLL are bit lines connected to the memory cell array MCA located at the left side in FIG. 1. The pair of bit lines BLR, bBLR are bit lines connected to the memory cell array MCA located at the right side in FIG. 1.

In the present embodiment, a fall-dead bit line structure is employed. Therefore, during data reading, one bit line of a bit line pair BLL, bBLL transmits data, and the other bit line transmits a reference data. One bit line of a bit line pair BLR, bBLR transmits data, and the other bit line transmits a reference data. The reference data is a potential or a current between a detection potential of data "1" and a detection potential of data "0". During data writing, the bit line bBLL transmits an inversion signal to the bit line BLL, and the bit line bBLR transmits an inversion signal to the bit line BLR.

The sense amplifier SA includes the sense nodes SN and bSN. The sense node SN is connected to the bit line BLL via the transfer gate TGL1, and is connected to the bit line BLR via the transfer gate TGR1. The sense node bSN is connected to the bit line bBLL via the transfer gate TGL2, and is connected to the bit line bBLR via the transfer gate TGR2. Further, the sense node SN is connected to the bit line bBLL via the transfer gate TGL3, and is connected to the bit line bBLR via the transfer gate TGR3. The sense node bSN is connected to the bit line BLL via the transfer gate TGL4, and is connected to the bit line BLR via the transfer gate TGR4.

The transfer gates TGL1 and TGL2 are on/off controlled by a signal VΦTL. The transfer gates TGR1 and TGR2 are on/off controlled by a signal VΦTR. The transfer gates TGL3 and TGL4 are on/off controlled by signals FBL and bFBL. The transfer gates TGR3 and TGR4 are on/off controlled by the signals FBL and bFBL.

The sense node SN is connected to the bit line BLL or BLR via the transfer gate TGL1 or TGR1 at the data reading time, thereby transmitting data of the memory cell MC. The sense node bSN is connected to the bit line bBLL or bBLR via the transfer gate TGL2 or TGR2 at the data reading time, thereby transmitting data of the memory cell MC. The sense node SN is connected to the bit line bBLL or bBLR via the transfer gate TGL3 or TGR3 at the data writing time, thereby writing data into the memory cell MC. The sense node bSN is connected to the bit line BLL or BLR via the transfer gate TGL4 or TGR4 at the data writing time, thereby writing data into the memory cell MC.

At the time of reading data from the bit line BLL, for example, a reference data is obtained from the bit line bBLL, and the data on the bit line BLL is compared with the reference data. As a result, the sense amplifier SA can determine whether data transmitted to the bit line BLL is "1" or "0". At the time of reading data from the bit lines BLL and bBLL, the bit lines BLR and bBLR are not connected to the sense nodes SN, bSN. On the other hand, at the time of reading data from the bit line BLR, the bit lines BLL and bBLL are not connected to the sense nodes SN, bSN.

When data on the bit line BLL is "1", a threshold value of the memory cell MC becomes lower than the reference potential. Therefore, the potential of the sense node SN becomes lower than the potential of the sense node bSN. As a result, in this case, in the refresh operation, a high potential needs to be given to the bit line BLL to write back data "1" into the memory cell MC. Accordingly, the transfer gate TGL4 is turned on to connect the high-potential sense node bSN to the bit line BLL. In order to give a low potential to the bit line bBLL, the transfer gate TGL3 is turned on, thereby connecting the low-potential sense node SN to the bit line bBLL.

The sense amplifier SA includes CMOS cross-coupled latch sense amplifiers (hereinafter, "latch circuits") LC1 and LC2. The latch circuit LC1 includes two p-type transistors TP1 and TP2 that are connected in series between the sense nodes SN and bSN. A gate of the transistor TP1 is connected to the sense node bSN, and a gate of the transistor TP2 is connected to the sense node SN. In other words, the gates of the transistors TP1 and TP2 are cross-coupled to the sense nodes SN and bSN. The latch circuit LC2 includes two n-type transistors TN1 and TN2 that are connected in series between the sense nodes SN and bSN. A gate of the transistor TN1 is connected to the sense node bSN, and a gate of the transistor TN2 is connected to the sense node SN. In other words, the gates of the transistors TN1 and TN2 are also cross-coupled to the sense nodes SN and bSN.

The sense node SA further includes p-type transistors TP3 to TP6. The transistor TP5 constitutes a current mirror, and try to pass the same current to the sense nodes SN and bSN. The transistors TP3 and TP4 are controlled by a signal bLOADON, and can switch between a power supply VBLH and the current mirror. Accordingly, at the data reading time, a current is passed from the power supply VBLH to the memory cell MC via the bit line, thereby generating a potential difference between the sense nodes SN and bSN.

The n-type transistor TN3 is connected between the sense nodes SN and bSN, and is controlled by a signal SHORT. The transistor TN3 short-circuits between the sense nodes SN and bSN before the reading/writing operation, thereby equalizing the sense nodes SN and bSN.

Figure 5:
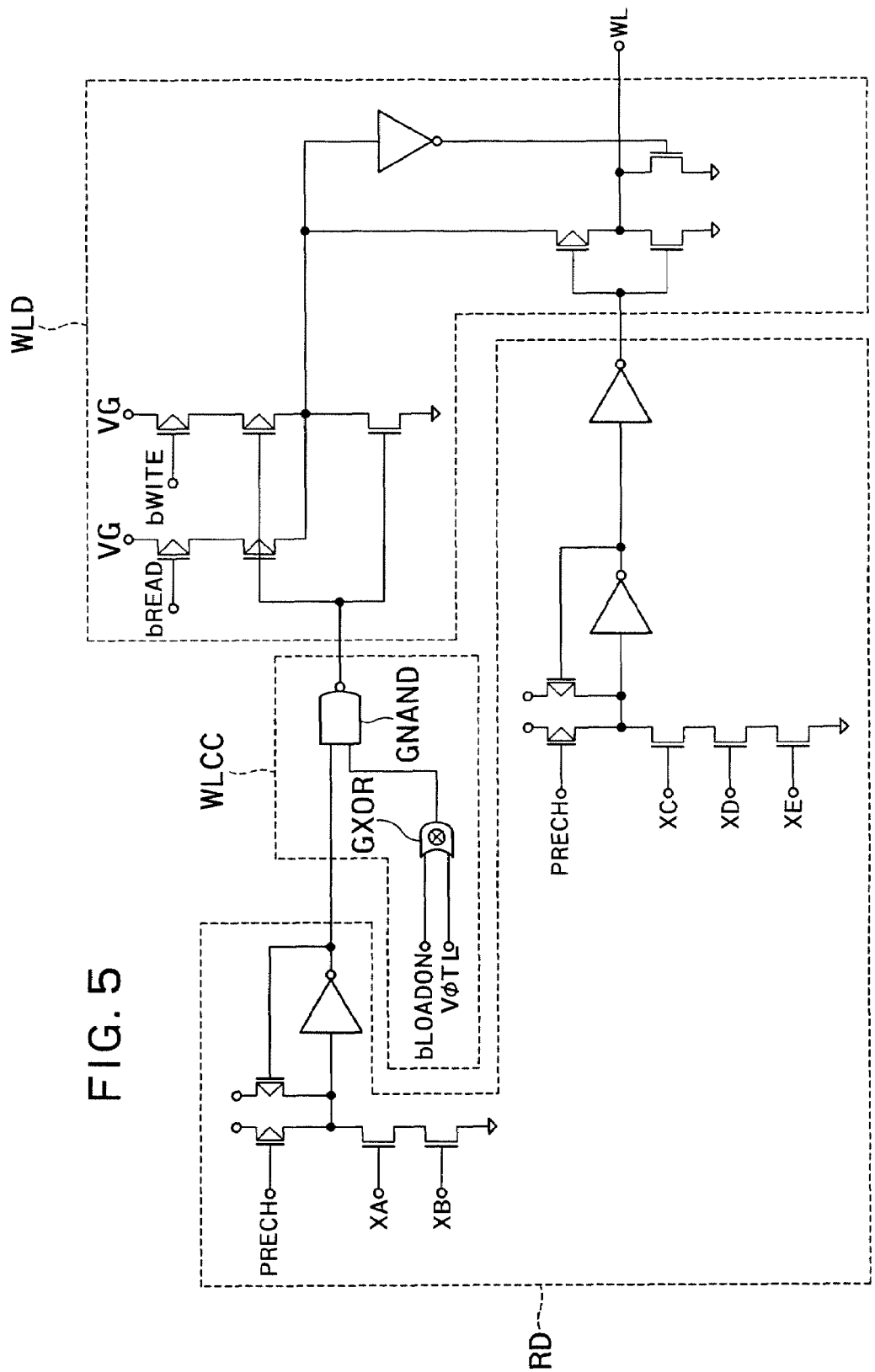
FIG. 5 is a circuit diagram showing a configuration of the word line control circuit WLCC, the word line driver WLD, and the row decoder RD.

FIG. 5 is a circuit diagram showing a configuration of the word line control circuit WLCC, the word line driver WLD, and the row decoder RD. The word line driver WLD and the row decoder RD can be similar to the conventional ones. However, according to the present embodiment, the word line control circuit WLCC is provided between the row decoder RD and the word line driver WLD. The word line control circuit WLCC includes an exclusive OR gate GXOR, and a NAND gate GNAD. The gate GXOR receives a load signal bLOADON and the control signal VΦTL (or a VΦTR), and operates these exclusive ORs. The gate GNAND operates NAND of an output of the gate GXOR and an output of the row decoder RD.

Based on this configuration, the word line control circuit WLCC passes an inversion signal of a signal from the row decoder RD to the word line driver WLD, when the load signal bLOADON and the control signal VΦTL (or a VΦTR) are inverted-phase signals. On the other hand, the word line control circuit WLCC inactivates the selection word line regardless of the signal from the row decoder RD, when the load signal bLOADON and the control signal VΦTL (or a VΦTR) are in-phase signals.

Figure 6:
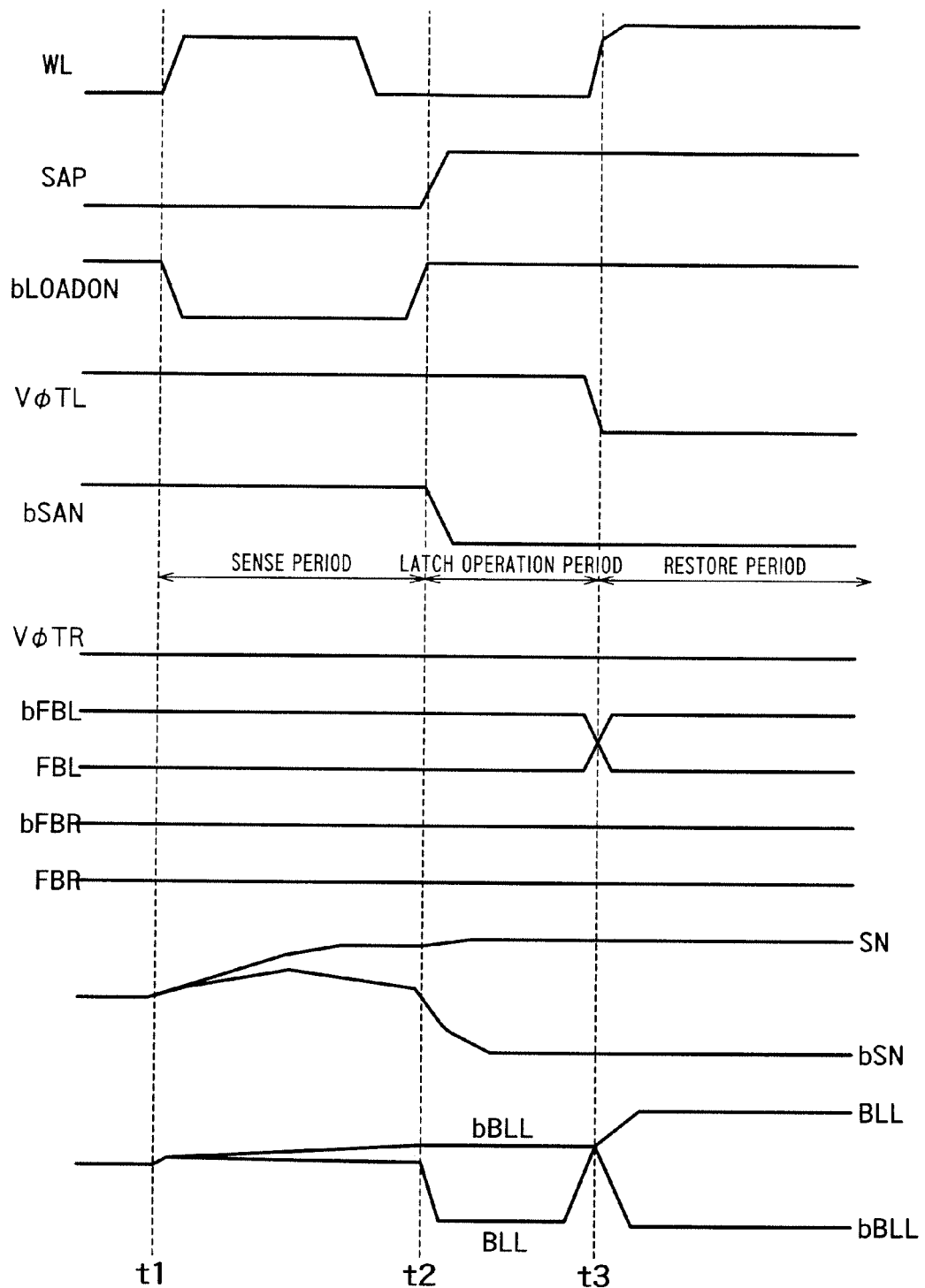
FIG. 6 is a timing chart showing a refresh operation of the FBC memory device 100 according to the first embodiment.

FIG. 6 is a timing chart showing a refresh operation of the FBC memory device 100 according to the present embodiment. In FIG. 6, it is assumed that the word line WL and the bit line BL within the memory cell array MCA shown at the left side of the sense amplifier SA in FIG. 1 are selected. Therefore, the signal VΦTR maintains LOW, and the transfer gates TGR1 to TGR4 shown in FIG. 4 keep the off state.

After the signal SHORT is set to LOW and the equalizing ends, the signal SAP and the load signal bLOADON become active at t1. The activation of the load signal bLOADON means a signal level at which the transistor TP3 and TP4 become on, that is, LOW. When the load signal bLOADON is also activated, a current from the power supply VBHL flows to the sense nodes SN and bSN. Because the control signal VΦTL is HIGH, the transfer gates TGL1 and TGL2 are turned on, and the current from the power supply VBHL flows to the memory cell MC via the bit lines BLL, bBLL. In this case, because the signals GBL, bFBL are inactive, the transfer gates TGL3 and TGL4 are in the off state.

Because the load signal bLOADON and the control signal VΦTL are inversed-phase signals, the inversion signal of the row decoder RD shown in FIG. 5 is transmitted to the word line driver WLD. Accordingly, the row decoder corresponding to the selection word line WL outputs LOW, and the power supply VG is connected to the selection word line WL. As a result, the selection word line WL rises to HIGH, and a sense period (a data reading period) is started. At t1, the signal SAP is started, and the latch circuit LC1 operates. The inversed-phase signals indicate opposite logical-polarity signals (logical "0" and "1").

A potential difference occurs between the sense nodes SN and bSN, due to a difference between the threshold voltage of the memory cell MC storing data "0" and the threshold voltage of the memory cell MC storing data "1". When this potential difference becomes sufficiently large (t2), the load signal bLOADON becomes inactive (HIGH). Accordingly, the power supply VBLH is disconnected from the sense nodes SN, bSN, and the sense period ends. In this case, because the signals bLOADON and VΦTL become in-phase signals, the word line control circuit WLCC shown in FIG. 5 outputs HIGH from the gate GNAND regardless of the output from the row decoder RD. As a result, the selection word line WL becomes inactive (LOW) regardless of the row address signal. The in-phase signals indicate same logical-polarity signals (logical "1" and "1", or logical "0" and "0").

After the selection word line WL becomes inactive, the signal bSAN operates the latch circuit LC2, as shown in FIG. 4. When the signal bSAN becomes active, the latch circuit LC2 operates, and shifts to the latch operation period. As a result, the data on the sense nodes SN, bSN are amplified. As described above, the data on the sense nodes SN, bSN are at a lower potential than a potential of the reference data, when the data are "1". When the data are "0", the potential becomes higher than a potential of the reference data. In other words, data of potential opposite to the potential of writing are read on the sense nodes SN, bSN.

Because the signal VΦTL does not become inactive and maintains the active state, data of inverse potential on the sense nodes SN, bSN is transmitted to the bit lines BLL, bBLL. However, in this case, because the selection word line WL is in the inactive state, opposite data is not written into the memory cell.

The latch period is from immediately before the latch circuit LC1 or LC2 starts a data latch operation until when the transfer gate disconnects the bit line from the sense node after completing the latch operation.

Next, at t3, the signal VΦTL declines to LOW. Accordingly, the transfer gates TGL1, TGL2 are turned off, and the sense node SN is disconnected from the bit line BLL, and also the sense node bSN is disconnected from the bit line bBLL. Substantially at the same time, the signals FBL, bFBL become active. Accordingly, the transfer gates TGL3 and TGL4 are turned on, the sense node SN is connected to the bit line bBLL, and the sense node bSN is connected to the bit line BLL. In this case, the latch circuits LC1 and LC2 latch data opposite to the data stored in the memory cell MC, in the sense nodes SN, bSN. Accordingly, the sense node SN is connected to the bit line bBLL, and the sense node bSN is connected to the bit line BLL, thereby writing correct data into the memory cell MC.

In the present embodiment, the latch circuit LC2 is operated by activating the signal bSAN at t2 during the sense period and the latch operation period. Thereafter, at t3 during the latch operation period and the restore period, the signal VΦTL is inactivated to disconnect the sense nodes SN, bSN from the bit lines BLL, bBLL. Because the word line WL is inactive during t2 and t3, the opposite signal during the latch operation period is not written into the memory cell MC. As a result, according to the present embodiment, the sense nodes SN, bSN do not become unstable during the refreshing of the memory cell, and the data in the memory cell can be accurately detected/latched, and can be also accurately restored (written back).

Second Embodiment

Figure 7:
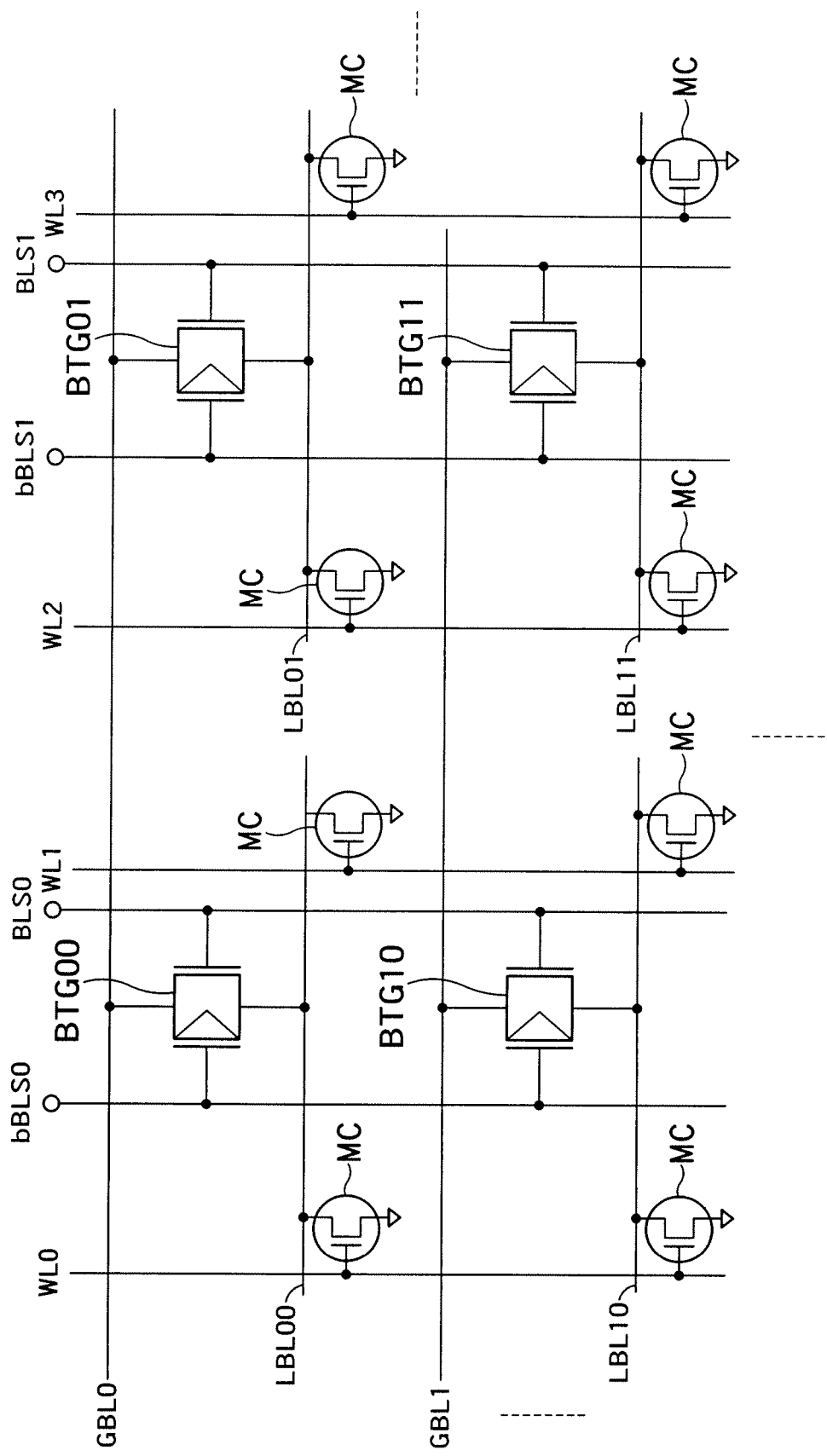
FIG. 7 is a circuit diagram showing the inside of a memory array MCA of an FBC memory device according to a second embodiment of the present invention.

FIG. 7 is a circuit diagram showing the inside of a memory array MCA of an FBC memory device according to a second embodiment of the present invention. In a second embodiment, the FBC memory device includes: local bit lines LBL00, 01, 10, 11, . . . (hereinafter, simply LBLs) that are connected to drains (or sources) of memory cells MCs, and transmit data of the memory cells; global bit lines GBLi that are provided corresponding to plural local bit lines LBLs; and bit line transfer gates BTG00, 01, 10, 11, . . . (hereinafter, simply BTGs) as first transfer gates connected to between the global bit line GBLi and the local bit line LBL. As explained above, in the second embodiment, the BGC memory device has a hierarchical bit line configuration. The bit line transfer gate BTG is provided corresponding to the local bit line LBL.

The bit line transfer gate BTG is controlled by the signals BLSi, bBLSi. Signal lines of the signals BLSi, bBLSi are provided corresponding to the word lines WLs, and extend to the extension direction (a column direction) of the word line WLs. The signals BLSi, bBLSi are used to simultaneously turn on/off the bit line transfer gates BTGs arrayed in the column direction. In other words, the signals BLS0, bBLS0 are used to simultaneously control the bit line transfer gate BTGi0, and the signals BLS1, bBLS1 are used to simultaneously control the bit line transfer gate BTGi1. In the second embodiment, a total configuration of the device, a configuration of the memory cell MC, and a configuration of the sense amplifier SA can be the same as those shown in the first embodiment (FIGS. 1, 3, and 4).

Figure 8:
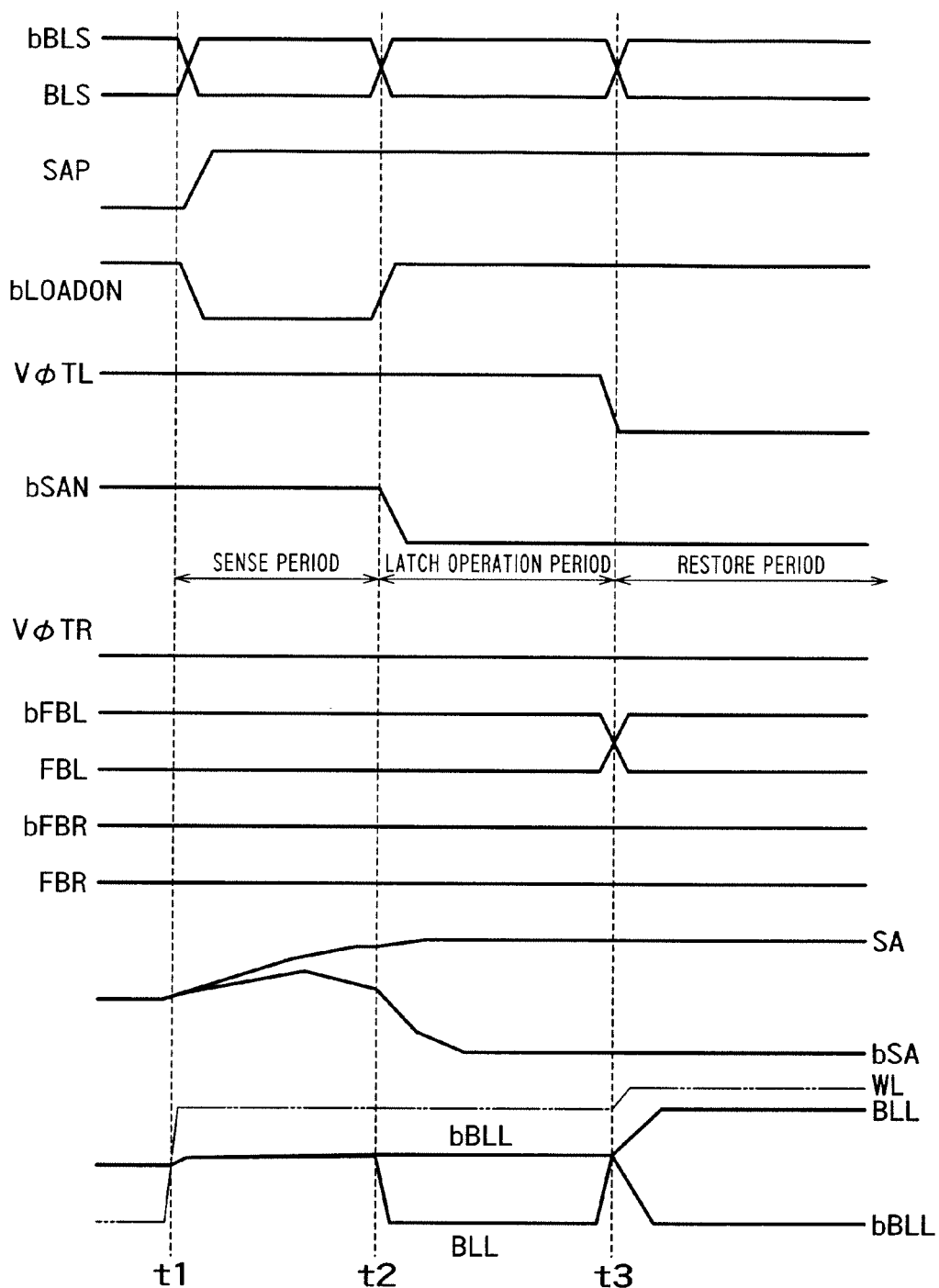
FIG. 8 is a timing chart showing an operation of the FBC memory device according to the second embodiment.

FIG. 8 is a timing chart showing an operation of the FBC memory device according to the second embodiment. In the second embodiment, the bit line transfer gate BTG is controlled to inactivate the selection word line WL during a latch operation period (t2 to t3). Operations of signals other than the signals BLS, bBLS and signals of the selection word line WL are similar to those according to the first embodiment. The signals BLS, bBLS shown in FIG. 8 are the signals corresponding to the selection word line WL. For example, when WL0 or WL1 in FIG. 7 is a selection word line, the signals BLS, bBLS mean the signals BLS0, bBLS0.

Figure 9:
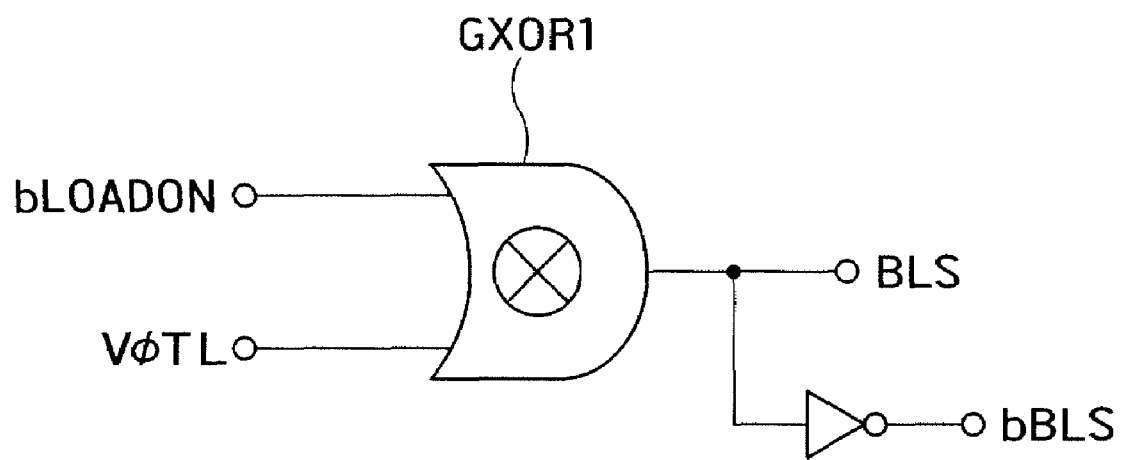
FIG. 9 shows an exclusive OR gate GXOR1 generating a signal BLS.

The signal BLS is generated by an exclusive OR gate GXOR1 shown in FIG. 9. The gate GXOR1 operates the exclusive OR of the load signal bLOADON and the control signal VΦTL, and outputs a result of this operation. The signal bBLS is an inversion signal of the signal BLS.

During a sense period from t1 to t2, the signals BLS and bBLS are activated to HIGH and LOW, respectively. Accordingly, selection local bit lines LBL corresponding to the selection word line WL are connected to the global bit lines GBL. When a word line WL1 is a selection word line, signals BLS0, bBLS0 are activated to HIGH and LOW, respectively. As a result, selection local bit lines LBLi0 (i=0, 1, 2, , , , ) are connected to the global bit lines GBLi. In this case, signals BLSi, bBLSi other than the signals BLS0, bBLS0 remain inactive. The selection word line and the selection local bit lines are respectively connected to selection memory cells from which data read.

During t2 to t3, when a load signal bLOADON is inactivated to HIGH, the signals BLS and bBLS are inactivated to LOW and HIGH, respectively. Accordingly, the local bit lines LBL corresponding to the selection word line WL are disconnected from the global bit lines GBL. In this case, although the selection word line WL is in the active state as shown by a chain double-dashed line shown in FIG. 8, the local bit lines LBL are disconnected from the global bit lines GBL. Therefore, opposite data latched by the latch circuits LC1 and LC2 are not written into the memory cell MC.

At t3, because the signal VΦTL becomes inactive (LOW), the selection local bit lines LBL corresponding to the selection word line WL are connected to the global bit lines again. In this case, because the signals FBL, bFBL become active, the data read during the sense period is restored into the memory cell MC via the transfer gates TGL3, TGL4 shown in FIG. 4.

In the second embodiment, an erroneous restoring of data into the memory cell is prevented by disconnecting the local bit line from the global bit line, instead of inactivating the selection word line during the latch operation. Accordingly, the second embodiment has an effect similar to that of the first embodiment.

In the first and second embodiments, after reading data, at t2, inactivation of the load signal bLOADOn and activation of the signal bSAN are carried out simultaneously. However, the timing of activating the signal bSAN can be immediately after the inactivation of the load signal bLOADON.

When the signal bSAN is activated before the load signal bLOADON is inactivated, a load current from the power supply VGLH and a current from the latch circuit LC2 become redundant, and flow together to the memory cell MC. Because the current from the latch circuit LC2 does not pass through the current mirror, there is a risk that data from the memory cell MC cannot be correctly detected. On the other hand, when a long time passes after the load signal bLOADON is inactivated, a difference of potentials between the sense nodes SN and bSN becomes gradually small. Therefore, it is preferable that the timing of the activation of the signal bSAN is immediately after the inactivation of the load signal bLOADON.

The above mentioned embodiments can be adopted to a data read operation, not only to a refresh operation. Because the data read operation includes the data sense operation, the data latch operation and the data restore operation shown in FIGS. 6 and 8.

The invention claimed is:

1. A semiconductor memory device comprising:
   memory cells including floating bodies in an electrically floating state and storing data based on a number of majority carriers within the floating bodies;
   word lines connected to gates of the memory cells;
   bit lines connected to drains or sources of the memory cells and transmitting data of the memory cells;
   sense nodes connected to the bit lines and transmitting data of the memory cells;
   transfer gates connected to between the bit lines and the sense nodes; and
   latch circuits latching data to the sense nodes, wherein
   in a data read operation, a selection word line is in an inactive state during a latch period which is from immediately before the latch circuits start a data latch operation until when the transfer gate disconnects the bit lines from the sense nodes after the latch operation, the selection word line being one of the word lines and being connected to selection memory cells from which data is to be read to the sense nodes.

2. The semiconductor memory device according to claim 1, further comprising:
   a word line driver driving the selection word line;
   a row decoder driving the word line driver following a row address signal; and
   a word line controller connected to between the word line driver and the row decoder, the word line controller setting the selection word line to an inactive state during the latch period on the basis of a logical operation of a load signal for applying a load current to the selection memory cells via the bit lines and a control signal for controlling the transfer gates.

3. The semiconductor memory device according to claim 2, wherein
   the word line controller comprises a first gate carrying out an exclusive OR of the load signal and the control signal; and a second gate outputting a NAND operation result of an output of the first gate and an output of the row decoder to the word line driver.

4. The semiconductor memory device according to claim 3, wherein
   the word line controller outputs a signal for activating the selection word line when the load signal and the control signal are opposite logical-polarity signals and outputs a signal for inactivating the selection word line when the load signal and the control signal are same logical-polarity signals.

5. The semiconductor memory device according to claim 2, wherein
   the load signal and the control signal are same logical-polarity signals during the latch period.

6. The semiconductor memory device according to claim 3, wherein
   the load signal and the control signal are same logical-polarity signals during the latch period.

7. The semiconductor memory device according to claim 4, wherein
the load signal and the control signal are same logical-polarity signals during the latch period.

8. The semiconductor memory device according to claim 1, wherein
the selection word line is in an active state during a sense period in which the sense nodes detect data of the selection memory cells, and during a restore period in which the latch circuits write back the latched data into the selection memory cells.

9. The semiconductor memory device according to claim 8, further comprising:
a word line driver driving the selection word line;
a row decoder driving the word line driver following a row address signal; and
a word line controller connected to between the word line driver and the row decoder, the word line controller setting the selection word line to an inactive state during the latch period on the basis of a logical operation of a load signal for applying load currents to the selection memory cells and a control signal for controlling the transfer gates.

10. The semiconductor memory device according to claim 9, wherein
the word line controller comprises a first gate carrying out an exclusive OR of the load signal and the control signal; and a second gate outputting a NAND operation result of an output of the first gate and an output of the row decoder to the word line driver.

11. The semiconductor memory device according to claim 10, wherein
the word line controller outputs a signal for activating the selection word line when the load signal and the control signal are opposite logical-polarity signals and outputs a signal for inactivating the selection word line when the load signal and the control signal are same logical-polarity signals.

12. The semiconductor memory device according to claim 9, wherein
the load signal and the control signal are opposite logical-polarity signals during the sense period and the restore period and are same logical-polarity signals during the latch period.

13. The semiconductor memory device according to claim 10, wherein
the load signal and the control signal are opposite logical-polarity signals during the sense period and the restore period and are same logical-polarity signals during the latch period.

14. The semiconductor memory device according to claim 11, wherein
the load signal and the control signal are opposite logical-polarity signals during the sense period and the restore period and are same logical-polarity signals during the latch period.

15. The semiconductor memory device according to claim 1, wherein
after reading data, the latch circuit is driven simultaneously with a time of an inactivation of a load signal for applying load currents to the selection memory cells via the bit lines, or immediately after the inactivation of the load signal.

16. The semiconductor memory device according to claim 1, wherein
the memory cells are floating body cells.

17. A semiconductor memory device comprising:
memory cells including floating bodies in an electrically floating state and storing data based on a number of majority carriers within the floating bodies;
word lines connected to gates of the memory cells;
local bit lines connected to drains or sources of the memory cells and transmitting data of the memory cells;
global bit lines respectively provided corresponding to a plurality of the local bit lines;
first transfer gates connected to between the global bit lines and the local bit lines;
sense nodes connected to the global bit lines and transmitting data of the memory cells;
second transfer gates connected to between the global bit lines and the sense nodes; and
latch circuits latching data to the sense nodes, wherein
in a data read operation, the first transfer gates between selection local bit lines and the global bit lines are set to off during a latch period from immediately before the latch circuits start a data latch operation until when the second transfer gates disconnect the global bit lines from the sense nodes after the latch operation, the selection local bit lines being included in the local bit lines and being connected to selection memory cells from which data is to be read.

18. The semiconductor memory device according to claim 17, wherein
after reading data, the latch circuits are driven simultaneously with an inactivation of a load signal for applying load currents to the selection memory cells via the global bit lines and the selection local bit lines, or immediately after the inactivation of the load signal.

19. A driving method of a semiconductor memory device, which comprises memory cells including floating bodies in an electrically floating state and storing data based on a number of majority carriers within the floating bodies; word lines connected to gates of the memory cells; bit lines connected to drains or sources of the memory cells and transmitting data of the memory cells; sense nodes connected to the bit lines and transmitting data of the memory cells; transfer gates connected to between the bit lines and the sense nodes; and latch circuits latching data to the sense nodes,
the driving method comprising:
activating a selection word line during a sense period in which data of selection memory cells is detected, the selection word line being one of the word lines and being connected to the selection memory cells from which data is to be read;
inactivating the selection word line during a latch period from immediately before the latch circuits start a data latch operation until when the transfer gates disconnect the bit lines from the sense nodes after the latch operation; and
activating the selection word line during a restore period in which the latch circuits write back latched data into the selection memory cells.

20. The driving method of a semiconductor memory device according to claim 19, wherein
an active state or an inactive state of the selection word line is controlled according to a logical operation of a load signal for applying load currents to the selection memory cells and a control signal for controlling the transfer gates.

* * * * *